United States Patent
Kim et al.

(10) Patent No.: US 12,490,495 B2
(45) Date of Patent: Dec. 2, 2025

(54) SEMICONDUCTOR DEVICE AND METHOD FOR MANUFACTURING THE SAME

(71) Applicant: SK hynix Inc., Gyeonggi-do (KR)

(72) Inventors: Dong Soo Kim, Gyeonggi-do (KR); Jung Ho Seo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 830 days.

(21) Appl. No.: 17/589,079

(22) Filed: Jan. 31, 2022

(65) Prior Publication Data
US 2022/0399456 A1 Dec. 15, 2022

(30) Foreign Application Priority Data
Jun. 11, 2021 (KR) .......................... 10-2021-0076126

(51) Int. Cl.
| | |
|---|---|
| *H10D 64/66* | (2025.01) |
| *H01L 21/28* | (2025.01) |
| *H01L 21/285* | (2006.01) |
| *H10B 12/00* | (2023.01) |
| *H10D 30/01* | (2025.01) |
| *H10D 30/62* | (2025.01) |
| *H10D 64/27* | (2025.01) |

(52) U.S. Cl.
CPC ..... *H10D 64/667* (2025.01); *H01L 21/28568* (2013.01); *H10B 12/31* (2023.02); *H10B 12/34* (2023.02); *H10D 30/024* (2025.01); *H10D 30/62* (2025.01); *H10D 64/513* (2025.01)

(58) Field of Classification Search
CPC ...... H10B 12/31; H10B 12/34; H10B 12/053; H10B 12/488; H10D 30/024; H10D 30/62; H10D 64/513; H10D 64/667; H01L 21/28568; H01L 21/28562; H01L 21/76877; H01L 23/53261
USPC .......................................... 257/306
See application file for complete search history.

(56) References Cited

U.S. PATENT DOCUMENTS

| | | | |
|---|---|---|---|
| 10,847,518 B2 * | 11/2020 | Wang | .................... H10B 12/485 |
| 10,879,398 B2 | 12/2020 | Lee et al. | |
| 2006/0147728 A1 * | 7/2006 | Shen | ...................... C23C 14/024 428/457 |
| 2009/0197410 A1 * | 8/2009 | Nakamura | ............... C23C 16/52 438/681 |

FOREIGN PATENT DOCUMENTS

| | | |
|---|---|---|
| KR | 10-2018-0118683 A | 10/2018 |
| KR | 10-2021-0032679 A | 3/2021 |

OTHER PUBLICATIONS

Office Action for Korean Patent Application No. 10-2021-0076126 issued by the Korean Intellectual Property Office (KIPO) on May 26, 2025.

* cited by examiner

*Primary Examiner* — Monica D Harrison
(74) *Attorney, Agent, or Firm* — IP & T GROUP LLP

(57) ABSTRACT

The present invention relates to a semiconductor device with improved reliability and a method for manufacturing the same. A semiconductor device according to the present invention may comprise: a substrate including a gate trench; a gate insulating layer formed on a surface of the gate trench; and silicon-doped metal nitride on the gate insulating layer, wherein the silicon-doped metal nitride has a silicon concentration of less than 1 at %.

19 Claims, 11 Drawing Sheets

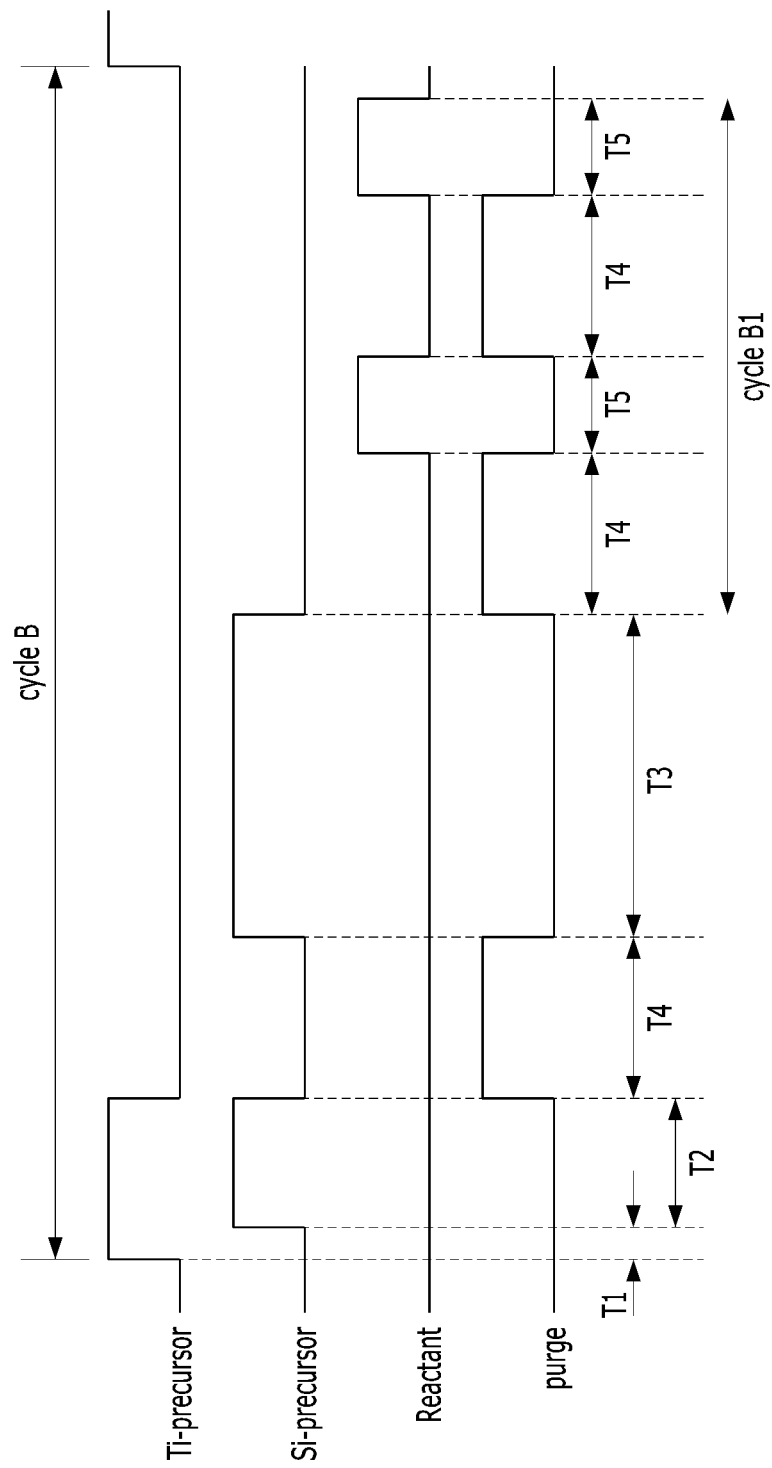

SEMICONDUCTOR DEVICE AND METHOD FOR MANUFACTURING THE SAME

CROSS-REFERENCE TO RELATED APPLICATIONS

The present application claims priority to Korean Patent Application No. 10-2021-0076126, filed on Jun. 11, 2021, which is incorporated herein by reference in its entirety.

BACKGROUND

1. Field

The present invention relates to a semiconductor device, and more particularly, to a semiconductor device having a buried gate structure and a method for fabricating the same.

2. Description of the Related Art

A metal gate electrode is applied for the high performance of the transistor. In particular, controlling the threshold voltage of a buried gate type transistor is required for high performance operation. In addition, gate induced drain leakage (GIDL) characteristics have a great influence on the performance of the buried gate transistor.

SUMMARY

Various embodiments of the present invention provide a semiconductor device having improved reliability and a method for fabricating the same.

A semiconductor device according to an embodiment of the present invention may comprise disposed inside the feature, wherein the void-free conductive layer includes silicon-doped metal nitride.

A semiconductor device according to an embodiment of the present invention may comprise a substrate including a gate trench; a gate insulating layer on a surface of the gate trench; and silicon-doped metal nitride on the gate insulating layer, wherein the silicon-doped metal nitride includes silicon at concentration of less than 1 at %.

A semiconductor device according to an embodiment of the present invention may comprise a substrate including a first doped region, a second doped region, and a gate trench between the first and second doped regions; a gate insulating layer formed on a surface of the gate trench; a buried word line disposed inside the gate trench over the gate insulating layer; a bit line connected to the first doped region; and a capacitor connected to the second doped region, wherein the buried word line includes silicon-doped titanium nitride having silicon concentration of less than 1 at %.

A method for fabricating a semiconductor device according to an embodiment of the present invention may comprise forming a feature in a substrate; and forming silicon-doped metal nitride inside the feature, wherein the silicon-doped metal nitride includes silicon-doped titanium nitride having a silicon concentration of less than 1 at %.

A semiconductor device according to an embodiment of the present invention may comprise a substrate including a trench; a gate insulating layer formed conformally inside the trench; a barrier layer formed conformally on the gate insulating layer to cover only partially the gate insulating layer; a low resistivity layer formed on the barrier layer; and a low work function layer formed on the low resistivity layer, wherein the barrier layer includes a silicon-doped titanium nitride, and the silicon-doped metal nitride includes has a silicon at a concentration of less than 1 at % and greater than 0 at %.

The present invention can deposit void-free titanium nitride by controlling the concentration of silicon to be less than 1 at % during silicon-doped titanium nitride deposition.

These and other features and advantages of the present invention will become apparent to the skilled person from the following description and figures.

BRIEF DESCRIPTION OF THE DRAWINGS

FIGS. 2A and 2B illustrate a method for atomic layer deposition of silicon-doped titanium nitride according to other embodiments of the present invention.

DETAILED DESCRIPTION

Figure 1A:
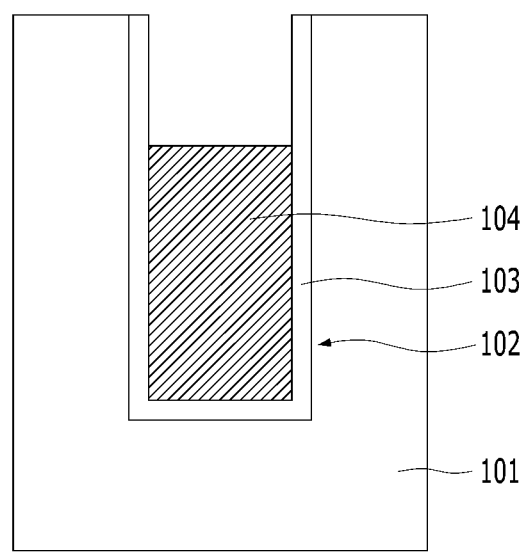
FIG. 1A is a diagram illustrating a semiconductor device according to an embodiment of the present invention.

Various embodiments described herein will be described with reference to cross-sectional views, plane views and block diagrams, which are schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

Figure 1B:
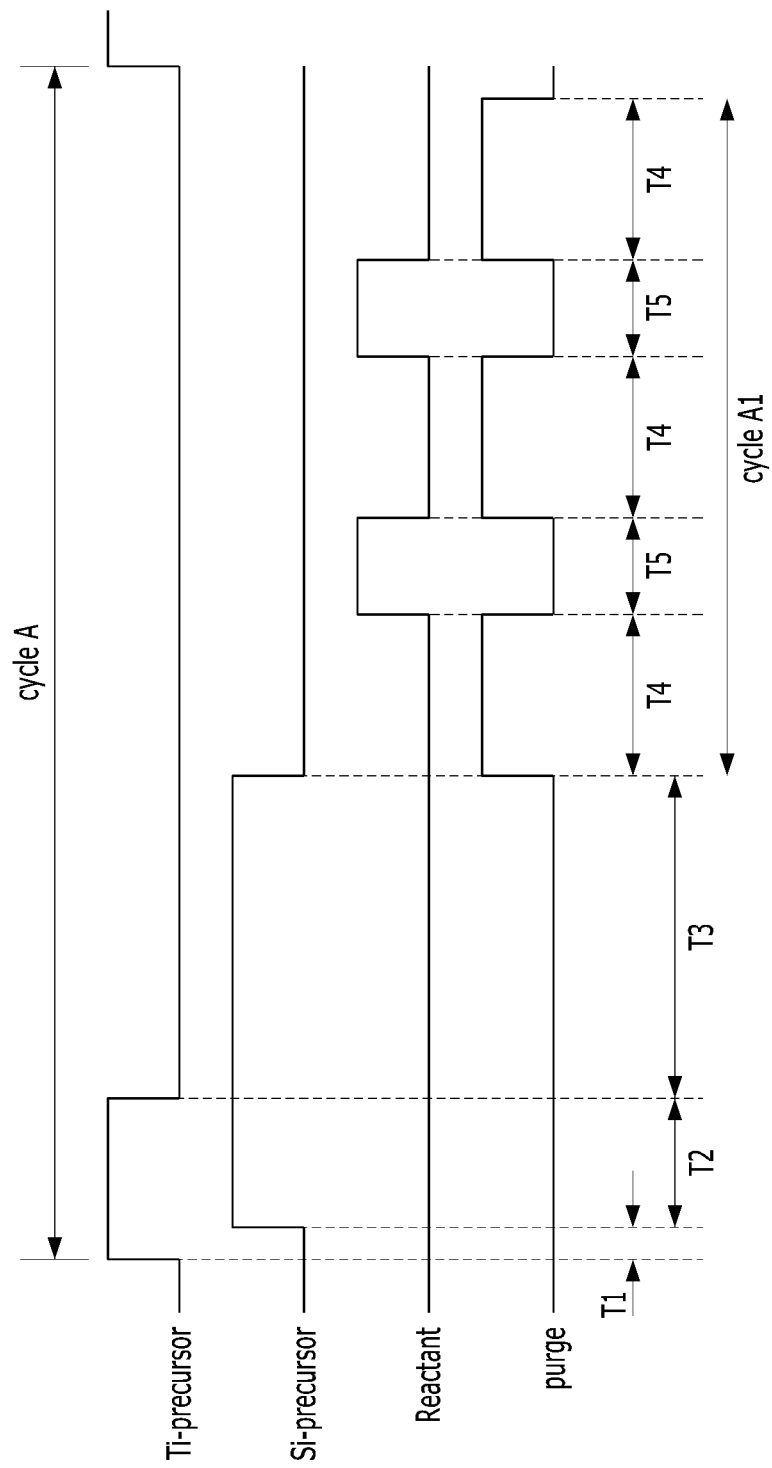
FIG. 1B is a gas supply timing diagram for deposition of silicon-doped titanium nitride.

FIG. 1A is a diagram illustrating a semiconductor device according to an embodiment of the present invention. FIG. 1B is a gas supply timing diagram for deposition of the void-free conductive layer of FIG. 1A.

Referring to FIG. 1A, a feature 102 may be formed in a substrate 101. The feature 102 may be formed by etching the substrate 101. The feature 102 may include a trench, recess, opening, or contact hole. The feature 102 may have a high aspect ratio. For example, the ratio of the height to the width of the feature 102 may be 10 or more.

An insulating layer 103 may be conformally formed on the feature 102. The insulating layer 103 may include, for example, silicon oxide, silicon nitride, silicon oxynitride, a high-k material, or a combination thereof.

A conductive layer 104 may be formed on at least part of the insulating layer 103 as shown in FIG. 1A. The conductive layer 104 may be formed by first filling the feature 102 with the conductive layer 104 over the insulating layer 103 and, then, by recessing the conductive layer 104 using an etch process, to only partially fill the feature 102. The etch process may be an etch back process.

The conductive layer 104 may be void-free. The conductive layer 104 may include, for example, a metal-based material. The conductive layer 104 may include a metal nitride which may include a dopant. The conductive layer 104 may include silicon-doped metal nitride, and the silicon-doped metal nitride may be chlorine-free and crystalline. The silicon-doped metal nitride may include silicon at a concentration of less than 1 at % and greater than 0 at %. The conductive layer 104 may include silicon-doped titanium nitride having a silicon concentration of less than 1 at % or silicon-doped tantalum nitride having a silicon concentration of less than 1 at %. The silicon-doped titanium nitride may include silicon at a concentration of less than 1 at % and greater than 0 at %. The silicon-doped tantalum nitride may include silicon at a concentration of less than 1 at % and greater than 0 at %.

In this embodiment, the conductive layer 104 may include titanium nitride containing a dopant. The dopant may include silicon. The conductive layer 104 may include titanium nitride containing silicon, and the titanium nitride containing silicon may be referred to hereinafter as 'silicon-doped titanium nitride'. Silicon-doped titanium nitride may be different from titanium silicon nitride (TiSiN). In the silicon-doped titanium nitride, silicon serves to remove impurities in the titanium nitride, and may also serve to suppress an increase in the resistivity of the titanium nitride. Impurities in titanium nitride may include chlorine, and silicon may serve to remove the chlorine. When the silicon concentration is 1 at % or more, the grain size may decrease as the titanium nitride becomes amorphous, thereby increasing the resistivity of the titanium nitride. Accordingly, the silicon-doped titanium nitride of this embodiment may have a silicon concentration of less than 1 at %. On the other hand, the chlorine is not removed in the absence of silicon so that grain coarsening of the titanium nitride occurs by a subsequent thermal process, and thus voids may be formed in the titanium nitride by the grain coarsening. It is necessary to improve the film quality of titanium nitride so that void-free densification simultaneously occurs even when the grain coarsening takes place due to a subsequent thermal process.

Impurities such as chlorine (Cl) in the titanium nitride may be removed to improve the film quality of the titanium nitride. For example, chlorine (Cl) may be removed by simultaneously flowing silane gas when flowing the titanium precursor. If the silicon concentration is increased to remove chlorine (Cl), titanium silicon nitride (TiSiN) is formed. In this case, the titanium nitride becomes amorphous, thereby reducing the grain size and increasing the resistivity. Therefore, it is necessary to adjust the flow amount of the silane gas so as to have a silicon concentration of less than 1 at %.

Silicon-doped titanium nitride having a silicon concentration of less than 1 at % may have lower resistivity than titanium silicon nitride (TiSiN) and silicon-doped titanium nitride having a silicon concentration of 1 at % or more. In addition, silicon-doped titanium nitride having a silicon concentration of less than 1 at % may be void-free, and silicon-undoped titanium nitride may include voids.

In this embodiment, silicon-doped titanium nitride having a silicon concentration of less than 1 at % is crystalline and may include grain boundaries as a conductive layer 104. Also, silicon-doped titanium nitride having a silicon concentration of less than 1 at % may be chlorine-free and crystalline.

A method of depositing the conductive layer 104 will be described with reference to FIG. 1B. The conductive layer 104 may be formed by atomic layer deposition (ALD) of silicon-doped metal nitride. The atomic layer deposition of silicon-doped metal nitride may repeat a cycle of flowing a metal precursor, flowing a silicon precursor, and flowing a nitrogen-based reactant gas. For example, FIG. 1B illustrates an atomic layer deposition (ALD) of silicon-doped titanium nitride. The silicon-doped titanium nitride may be formed by the ALD, and deposited at a temperature of from 450° C. to 480° C.

Referring to FIG. 1B, the atomic layer deposition of silicon-doped titanium nitride may repeat a first cycle (cycle A) several times. The first cycle (cycle A) may include flowing titanium precursor (Ti-precursor) for a time T1, co-flowing titanium precursor/silicon precursor (Ti-precursor/Si-precursor) for a time T2, flowing silicon precursor (Si-precursor) for a time T3, performing a purge for a time T4, flowing a reactant gas for a time T5 while stopping the purge, stopping the flowing of the reactant gas and performing another purge for the time of T4, and stopping the purge and flowing the reactant gas for the time of T5. The flowing of the reactant gas and the purge operations may be repeated a number of times in an alternating mode. The purge and flowing of the reactant gas repeated operations may be referred to as a first sub-cycle A1. Thus, the first cycle (cycle A) may include a first sub-cycle (sub-cycle A1) performed after the operation of flowing only the silicon precursor, i.e., after the end of time T3 and the first sub-cycle (sub-cycle A1) may include purge and flowing the reactant gas. The alternating purging and flowing the reactant gas operations of the first sub-cycle (sub-cycle A1) may be repeated several times.

The titanium precursor may include, for example, titanium tetrachloride ($TiCl_4$), and the silicon precursor may include silane ($SiH_4$) or dichlorosilane (DCS). The reactant gas may include a nitrogen-based reactant gas, such as ammonia ($NH_3$). The purge gas may include an inert gas such as argon (Ar) or nitrogen ($N_2$).

The titanium precursor/silicon precursor co-flow may include flowing (or injecting) the silicon precursor while maintaining the flow of the titanium precursor. Purge may not be performed between the titanium precursor flow and the titanium precursor/silicon precursor co-flow, and purge may not be performed between the titanium precursor/silicon precursor co-flow and the silicon precursor flow.

Titanium precursor (Ti-precursor) flow, titanium precursor/silicon precursor (Ti-precursor/Si-precursor) co-flow, and silicon precursor (Si-precursor) flow may be performed by flowing the titanium precursor for a first time T1, co-flowing the titanium precursor and the silicon precursor for a second time T2, and flowing the silicon precursor for a third time T3. Purge may be performed for a fourth time T4, and reactant gas flow may be performed for a fifth time T5.

A total flow time of the titanium precursor (T1+T2) may be shorter than a total flow time of the silicon precursor (T2+T3). The total flow time of the silicon precursor (T2+T3) may be about 3 times longer than the total flow time of the titanium precursor (T1+T2). The first time T1 for flowing only the titanium precursor may be shorter than the second time T2 for co-flowing the titanium precursor and the silicon precursor. For example, the total flow time of the silicon precursor (T2+T3) may be about 15 seconds, the total flow time of the titanium precursor (T1+T2) may be about 5 seconds, and the first time T1 of flowing only the titanium precursor may be about 1 second, and the second time T2 for co-flowing the titanium precursor and the silicon precursor may be about 4 seconds. The total flow time of the titanium precursor (T1+T2) and the purge time T4 may be the same. The reactant gas flow time T5 may be shorter than the purge time T4. The flow rate of the silicon precursor may be smaller than the flow rate of the titanium precursor to control the silicon concentration to be less than 1 at %.

Figure 2B:
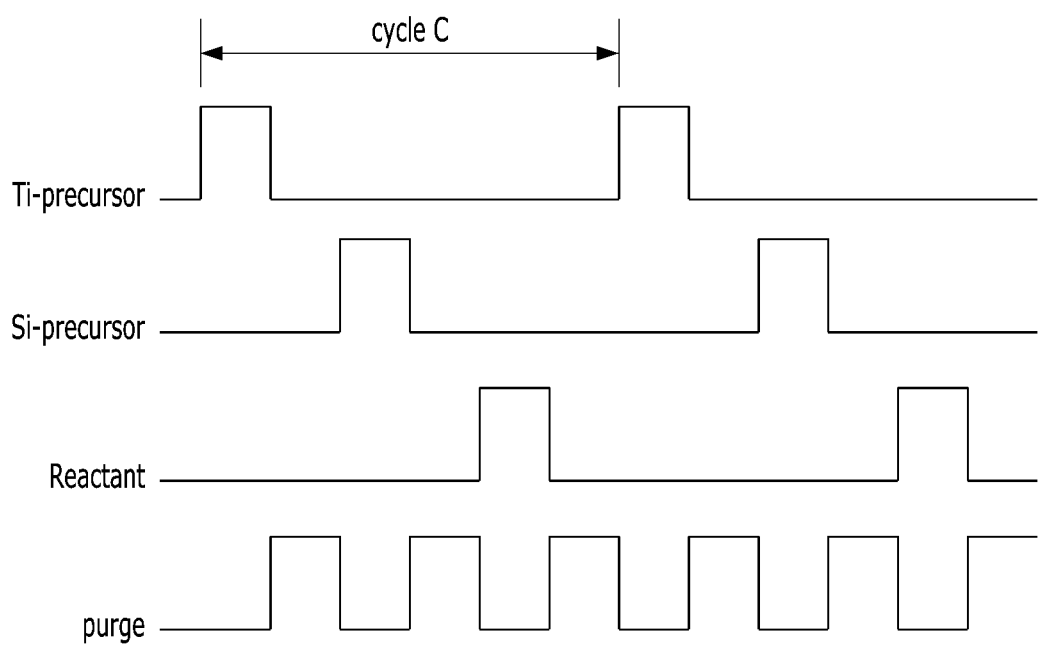

FIGS. 2A and 2B illustrate an atomic layer deposition method of silicon-doped titanium nitride according to other embodiments. The silicon-doped titanium nitride may be formed by the ALD, and deposited at a temperature of from 450° C. to 480° C.

Referring to FIG. 2A, the atomic layer deposition of silicon-doped titanium nitride may repeat a second cycle (cycle B) several times. The second cycle (cycle B) may include titanium precursor flow, titanium precursor/silicon precursor co-flow, purge, silicon precursor flow, and reactant gas flow and purge. The second cycle (cycle B) may include a second sub-cycle (sub-cycle B1) after the silicon precursor flow, and the second sub-cycle (sub-cycle B1) may include purge and reactant gas flow. The second sub-cycle (sub-cycle B1) may be repeated several times.

The titanium precursor may include, for example, titanium tetrachloride ($TiCl_4$). The silicon precursor may include, for example, silane ($SiH_4$) or dichlorosilane (DCS). The reactant gas may include a nitrogen-based reactant gas, such as ammonia ($NH_3$). The purge gas may include an inert gas such as argon (Ar) or nitrogen ($N_2$). The titanium precursor/silicon precursor co-flow may flow the silicon precursor while maintaining the titanium precursor flow. Purge may not be performed between the titanium precursor flow and the titanium precursor/silicon precursor co-flow. Purge may be performed between the titanium precursor/silicon precursor co-flow and the silicon precursor flow.

Titanium precursor flow, titanium precursor/silicon precursor flow, and silicon precursor flow may be performed by flowing the titanium precursor for a first time T1, co-flowing the titanium precursor and the silicon precursor for a second time T2, and flowing only the silicon precursor for a third time T3. The purge may be performed for a fourth time T4, and reactant gas flow may be performed for a fifth time T5.

The total flow time of the titanium precursor (T1+T2) may be shorter than the total flow time of the silicon precursor (T2+T3). The total flow time of the silicon precursor (T2+T3) may be about 3 times longer than the total flow time of the titanium precursor (T1+T2). The first time T1 of flowing only the titanium precursor may be shorter than the second time T2 of co-flowing the titanium precursor and the silicon precursor. For example, the total flow time of the silicon precursor (T2+T3) may be about 15 seconds, the total flow time of the titanium precursor (T1+T2) may be about 5 seconds, the first time T1 of flowing only the titanium precursor may be about 1 second, and the second time T2 of co-flowing the titanium precursor and the silicon precursor may be about 4 seconds. The total flow time of the titanium precursor (T1+T2) and the purge time T4 may be the same, and the reactant gas flow time T5 may be shorter than the purge time T4.

Referring to FIG. 2B, the atomic layer deposition of silicon-doped titanium nitride may repeat a third cycle (cycle C) several times. The third cycle (cycle C) may include a titanium precursor flow, purge, silicon precursor flow, purge, reactant gas flow (reactant), and purge. The titanium precursor may include, for example, titanium tetrachloride ($TiCl_4$), and the silicon precursor may include silane ($SiH_4$) or dichlorosilane ($SiH_2Cl_2$, DCS). The reactant gas may include a nitrogen-based reactant gas, such as ammonia ($NH_3$). The purge gas may include an inert gas such as argon (Ar) or nitrogen ($N_2$). In the third cycle (cycle C), the titanium precursor and the silicon precursor may not be simultaneously flowed. In the third cycle (cycle C), the titanium precursor flow and the silicon precursor flow may be performed prior to the reactant gas flow.

Referring to FIGS. 1B to 2B, in the first to third cycles (cycle A, cycle B, and cycle C), the titanium precursor and the silicon precursor may be flowed before the nitrogen-based reactant gas. In this way, the silicon concentration may be controlled to less than 1 at % because the titanium precursor and the silicon precursor are first flowed. In addition, the deposition of titanium silicon nitride (TiSiN) may be suppressed because the titanium precursor and the silicon precursor are first flowed.

A Ti—Si layer including titanium and silicon may be formed as an initial layer because the first to third cycles (cycle A, cycle B, and cycle C) flow a titanium precursor and a silicon precursor before a nitrogen-based reactant gas is flowed. The Ti—Si layer may include Ti—Si bonding. The ratio of the amount of titanium to the amount of silicon contained in the Ti—Si layer (Ti/Si concentration ratio) may be controlled by adjusting the flow rate ratio of the titanium precursor/silicon precursor. In addition, impurities such as chlorine (Cl) may be reduced when the titanium precursor and the silicon precursor are flowed before the reactant gas. For example, when the $TiCl_4$ gas and the $SiH_4$ gas are simultaneously supplied, the Ti—Cl bond and the Si—H bond included in the Ti—Si layer may be broken. Cl or H separated from Ti or Si, respectively, reacts with each other to form gaseous byproducts such as HCl, $Cl_2$, and $H_2$, and the gaseous byproducts may not remain in the Ti—Si layer and may be desorbed from the surface of the Ti—Si layer. When the $TiCl_4$ gas and the $SiH_4$ gas are simultaneously supplied, the flow rate ratio of the titanium precursor/silicon precursor may be controlled so that the silicon concentration in the Ti—Si layer is less than 1 at %.

In the first to third cycles (cycle A, cycle B, and cycle C), purge and reactant gas flow may be sequentially performed after the Ti—Si layer is formed. When $NH_3$ is injected as a reactant gas, the Ti—Si layer may be nitrided. That is, by reacting Ti and Si included in the Ti—Si layer with N included in the $NH_3$ gas, the Ti—Si layer may be changed into a Ti—Si—N layer including Ti, Si and N. In addition, even when Ti—Cl bonds or Si—H bonds remain in the Ti—Si layer, these bonds may be broken by flowing a reactant gas. Cl or H separated from Ti or Si, respectively, reacts with each other to form gaseous byproducts such as HCl, $Cl_2$, and $H_2$. The gaseous byproducts may not remain in the Ti—Si—N layer and may be desorbed from the surface of the Ti—Si—N layer. The Ti—Si—N layer may be a high-quality layer having fewer impurities such as chlorine (Cl) than the Ti—Si layer. The Ti—Si—N layer may be silicon-doped titanium nitride.

Figure 3A:
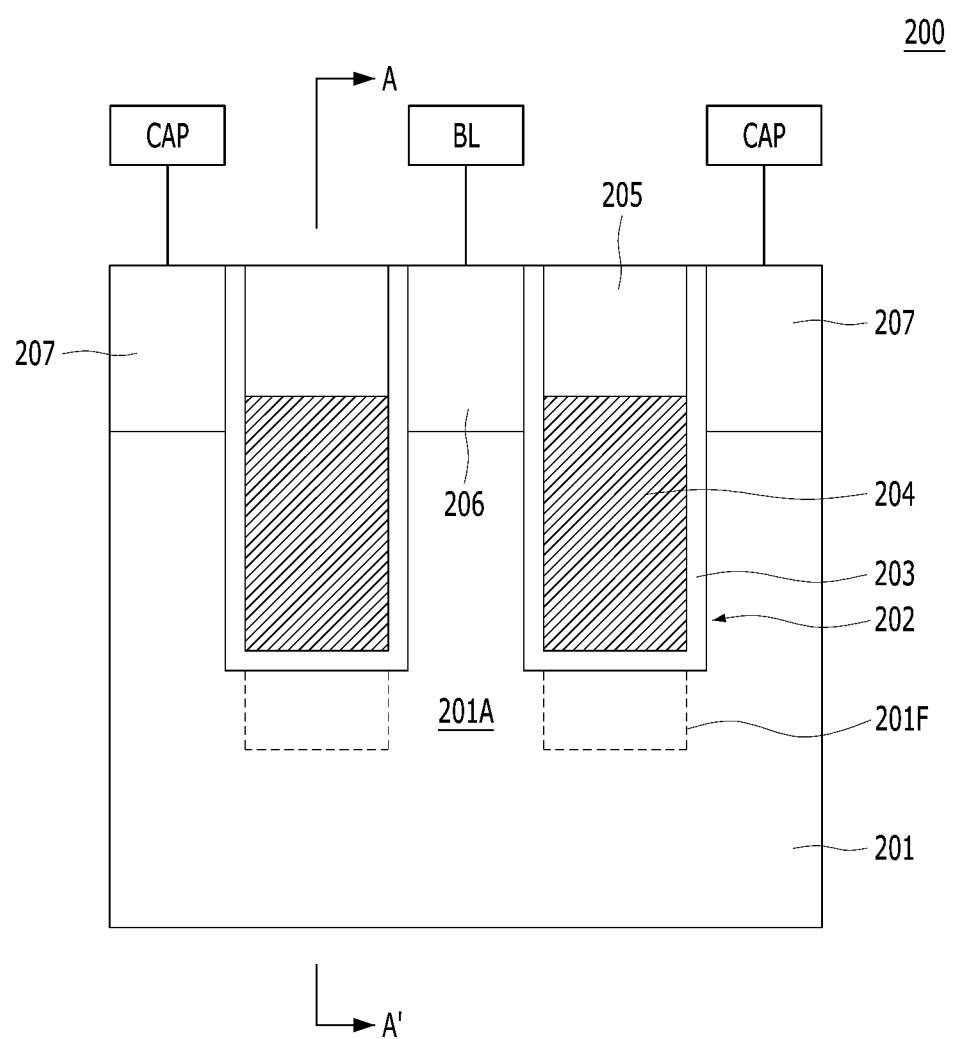
FIGS. 3A to 3D are diagrams illustrating semiconductor devices according to other embodiments of the present invention.
Figure 3B:
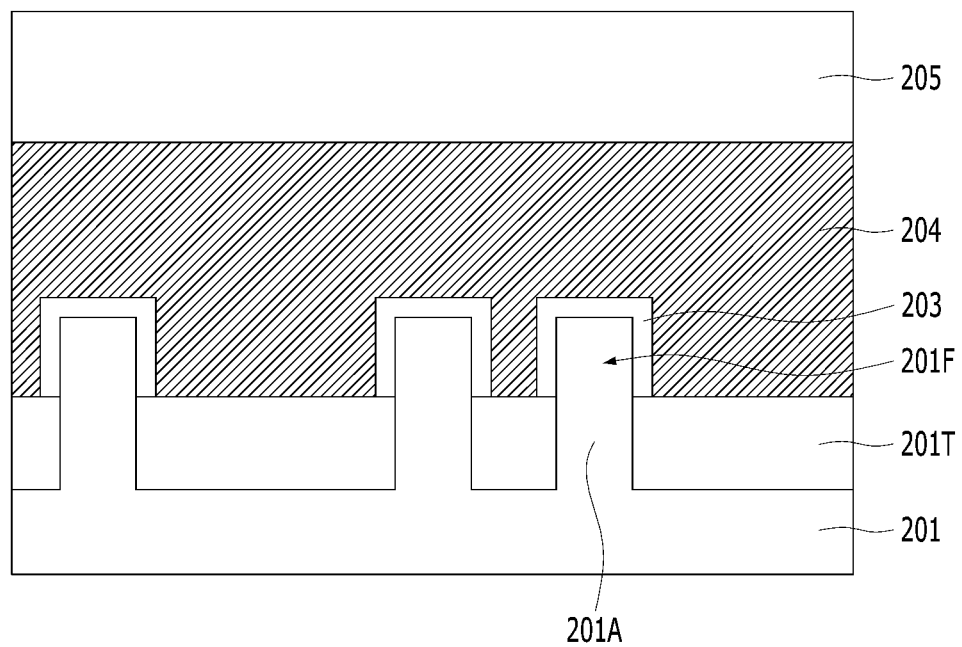
Figure 3C:
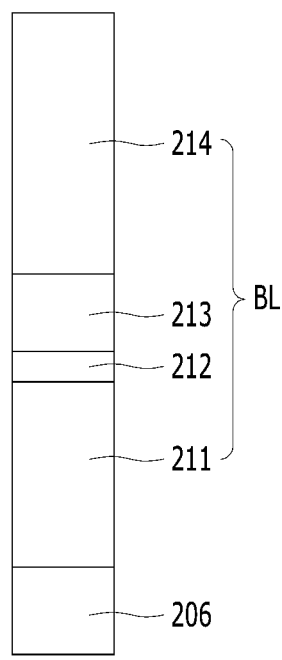
Figure 3D:
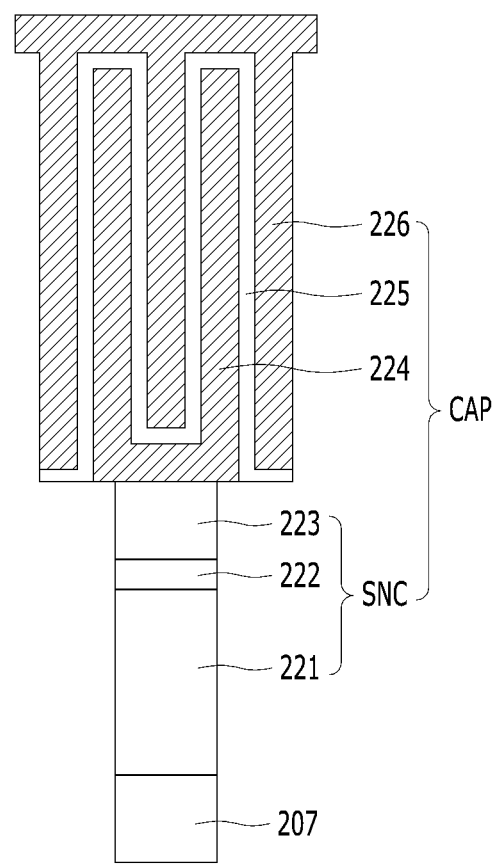

FIGS. 3A to 3D are diagrams illustrating semiconductor devices according to other embodiments of the present invention. FIG. 3B is a cross-sectional view taken along the line A-A' of FIG. 3A, FIG. 3C is a detailed view of the bit line structure BL of FIG. 3A, and FIG. 3D is a detailed view of the capacitor structure CAP of FIG. 3A.

Referring to FIGS. 3A to 3D, the semiconductor device 200 may include a substrate 201, a buried word line 204, a bit line structure BL, and a capacitor structure CAP. The semiconductor device 200 may be a part of a memory cell. For example, the semiconductor device 200 may be a part of a memory cell of a DRAM (Dynamic Random-Access Memory).

The substrate 201 may be a material suitable for semiconductor processing. The substrate 201 may include a semiconductor substrate. The substrate 201 may be made of a material containing silicon. The substrate 201 may include, for example, silicon, monocrystalline silicon, polysilicon, amorphous silicon, silicon germanium, monocrystalline silicon germanium, polycrystalline silicon germanium, carbon doped silicon, a combination thereof, or multiple layers thereof. The substrate 201 may include other semiconductor materials such as germanium. The substrate 201 may include a III/V group semiconductor substrate, for example, a compound semiconductor substrate such as GaAs. The substrate 201 may include a silicon on insulator (SOI) substrate.

The substrate 201 may include an active region 201A, an isolation layer 201T, and a trench 202. The active region 201A may include a fin region 201F. The fin region 201F may be located below trench 202. The fin region 201F is formed as a portion of the device isolation layer 201T under the trench 202 which is recessed. A sidewall of the fin region 201F is exposed by the recessed device isolation layer 201T. The fin region 201F is a portion in which a part of the channel is formed. The fin region 201F is referred to as a saddle fin. A channel width may be increased by the fin region 201F, and electrical characteristics may be improved. In another embodiment, the fin region 201F may be omitted.

A gate insulating layer 203 may be formed on a surface of the trench 202. A buried word line 204 may be formed on the gate insulating layer 203. The buried word line 204 may partially fill the trench 202 on the gate insulating layer 203. A capping layer 205 may be formed on the buried word line 204. The buried word line 204 may cover sidewalls and a top surface of the fin region 201F. The buried word line 204 may be filled without a void between the neighboring fin regions 201F.

A first and a second doped region 206 and 207 may be formed on the substrate 201 separated by the trench 202. The first and second doped regions 206 and 207 are doped with a conductive dopant including, for example, phosphorus (P), arsenic (As), antimony (Sb), or boron (B). The first and second doped regions 206 and 207 may be doped with dopants of the same conductivity type. The first and second doped regions 206 and 207 may be disposed in the substrate 201 on both sides of the trench 202. Bottom surfaces of the first and second doped regions 206 and 207 may be located at a same predetermined depth from a top surface of the substrate 201. The first and second doped regions 206 and 207 may each contact an opposite sidewall of the trench 202. Bottom surfaces of the first and second doped regions 206 and 207 may be located at a higher level than the bottom surface of the trench 202. The first and second doped regions 206 and 207 may be referred to as a first source/drain region, and a second source/drain region, respectively.

The first doped region 206 may be connected to the bit line structure BL. The second doped regions 207 may be connected to the capacitor structure CAP.

Referring now to FIG. 3C, the bit line structure BL may include a bit line contact plug 211 connected to the first doped region 206, a first barrier layer 212 disposed on the bit line contact plug 211, a bit line 213 disposed on the first barrier layer 212, and a bit line capping layer 214 disposed on the bit line 213.

Referring to FIG. 3D, the capacitor structure CAP may include a storage node contact plug SNC connected to the second doped region 207, the storage node 224 disposed on the storage node contact plug SNC, a dielectric layer 225 disposed on the storage node 224, and a plate node 226 disposed on the dielectric layer 225. The storage node contact plug SNC may include a lower plug 221, a second barrier layer 222, and an upper plug 223 sequentially stacked in the recited order.

Referring to FIGS. 3C and 3D, each of the first and second barrier layers 212 and 222 may include, for example, silicon-doped titanium nitride. The silicon-doped titanium nitride may include silicon at a concentration of less than 1 at % and greater than 0 at %. Each of the storage node 224 and the plate node 226 of the capacitor structure CAP may include silicon-doped titanium nitride, and the silicon-doped titanium nitride may include silicon at a concentration of less than 1 at % and greater than 0 at %.

Although not shown, in another embodiment of the present invention, the substrate 201 may include a semiconductor substrate and an oxide semiconductor layer disposed on the semiconductor substrate. The semiconductor substrate may include, for example, silicon, germanium, or silicon germanium. The oxide semiconductor layer may include a compound of oxygen and at least two metals selected from the group consisting of zinc (Zn), indium (In), gallium (Ga), and tin (Sn). For example, the oxide semiconductor layer may include indium gallium zinc oxide (IGZO) or indium tin zinc oxide (ITZO).

The gate insulating layer 203 may include, for example, silicon oxide, silicon nitride, silicon oxynitride, a high-k material, or a combination thereof. The high-k material may include a material having a higher dielectric constant than that of silicon oxide. For example, the high-k material may include a material having a dielectric constant greater than 3.9. In another embodiment, the high-k material may include a material having a dielectric constant greater than 10. In yet another embodiment, the high-k material may include a material having a dielectric constant of 10 to 30. The high-k material may include at least one metallic element. The high-k material may include a hafnium-containing material. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, or a combination thereof. Other known high-k material may be optionally used as a high-k material. The gate insulating layer 203 may include a metal oxide.

The buried word line 204 may be void-free. The buried word line 204 may include a metal-based material. The metal-based material may include a metal nitride, which may include a dopant. For example, the buried word line 204 may include titanium nitride containing a dopant such as, for example, silicon. The buried word line 204 may include silicon-doped titanium nitride having a silicon concentration of less than 1 at %. The silicon-doped titanium nitride may include silicon at a concentration of less than 1 at % and greater than 0 at %.

The buried word line 204 may be formed by atomic layer deposition as referenced in FIGS. 1B to 2B. In another embodiment of the present invention, the buried word line 204 may include silicon-doped titanium nitride deposited by different methods, such as, for example, physical vapor deposition (PVD) or chemical vapor deposition (CVD).

The capping layer 205 may protect the buried word line 204. The capping layer 205 may fill the remaining space of the trench 202 on the buried word line 204. The upper surface of the capping layer 205 may be positioned at the same level as the upper surface of the first and second doped regions 206 and 207. The capping layer 205 may include an insulating material. The capping layer 205 may include silicon nitride, silicon oxynitride, or a combination thereof. In another embodiment, the capping layer 205 may include a combination of silicon nitride and silicon oxide. The capping layer 205 may include a silicon nitride liner and a spin on dielectric (SOD) material. The capping layer 205 may have a triple structure of oxide-nitride-oxide (ONO).

Figure 4:
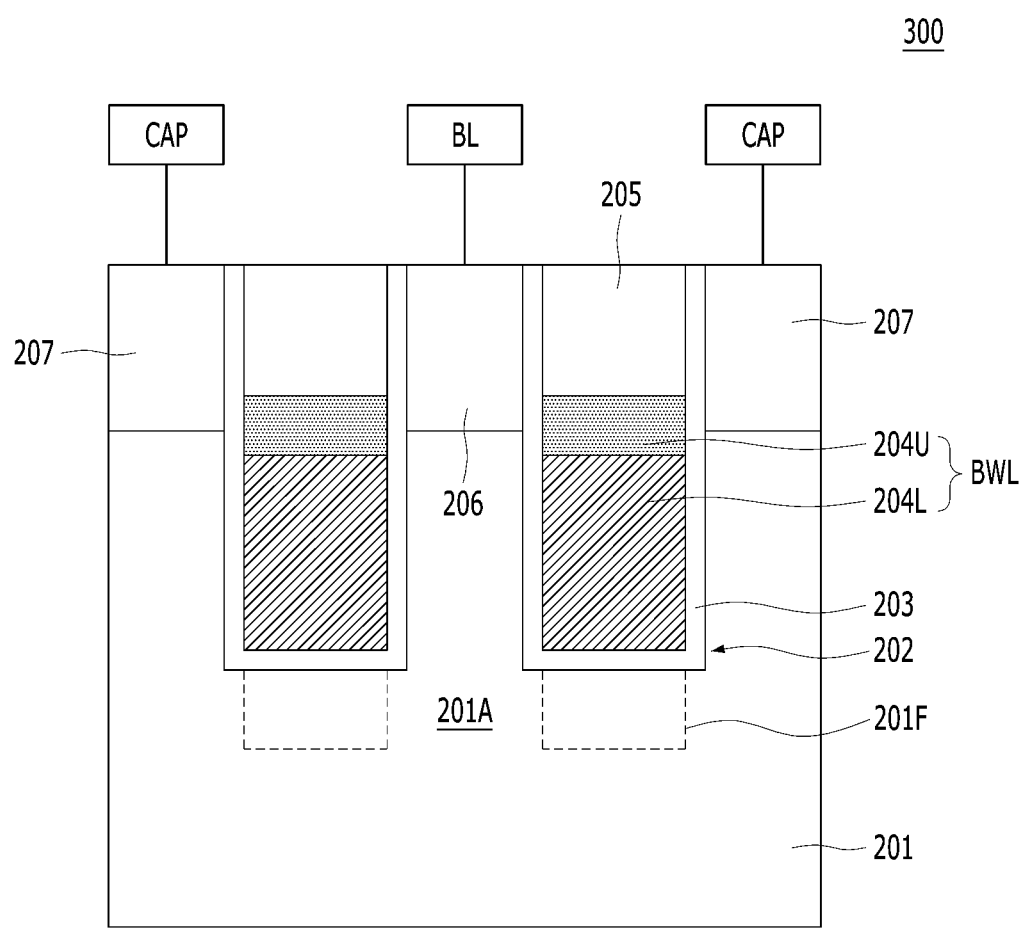
FIGS. 4 to 6 are diagrams illustrating semiconductor devices according to other embodiments of the present invention.

FIG. 4 is a diagram illustrating a semiconductor device according to another embodiment of the present invention. The semiconductor device 300 of FIG. 4 may be similar to the semiconductor device 200 of FIG. 3A. Hereinafter, detailed descriptions of duplicate components may be omitted.

Referring to FIG. 4, the semiconductor device 300 may include a substrate 201 and a buried word line BWL embedded in the substrate 201. A gate insulating layer 203 may be formed conformally on a surface of the trench 202. A buried word line BWL may be formed on the gate insulating layer 203. The buried word line BWL may partially fill the trench 202 on the gate insulating layer 203. A capping layer 205 may be formed on the buried word line BWL to fill the remainder of the trench 202.

The buried word line BWL may include a lower conductive layer 204L and an upper conductive layer 204U formed on the lower conductive layer 204L. The lower conductive layer 204L may have a shape filling the bottom of the trench 202. A top surface of the lower conductive layer 204L may be at a lower level than the bottom surface of the first and second doped regions 206 and 207. The lower conductive layer 204L and the upper conductive layer 204U may be made of different materials.

The lower conductive layer 204L may be free of any voids. The lower conductive layer 204L may be a void-free layer. The lower conductive layer 204L may include a metal-based material including, for example, a metal nitride which may include a dopant. For example, the lower conductive layer 204L may include titanium nitride containing a dopant such as, for example, silicon. The lower conductive layer 204L may include silicon-doped titanium nitride having a silicon concentration of less than 1 at %. The silicon-doped titanium nitride may include silicon at a concentration of less than 1 at % and greater than 0 at %.

The upper conductive layer 204U may include a material having a lower work function than the lower conductive layer 204L. That is, the upper conductive layer 204U may include a low work function material, and the lower conductive layer 204L may include a high work function material. The upper conductive layer 204U may include a low work function metal or an N-type polysilicon.

In this embodiment, the lower conductive layer 204L may be a silicon-doped titanium nitride, and the upper conductive layer 204U may be an N-type polysilicon. Gate-induced drain leakage (GIDL) may be improved by the low work function of the upper conductive layer 204U.

The lower conductive layer 204L may include a silicon-doped titanium nitride formed by atomic layer deposition as referenced in FIGS. 1B to 2B. In another embodiment, the lower conductive layer 204L may include silicon-doped titanium nitride deposited by a different method, such as, for example, physical vapor deposition (PVD) or chemical vapor deposition (CVD). The upper conductive layer 204U may be formed by atomic layer deposition (ALD), physical vapor deposition (PVD), or chemical vapor deposition (CVD).

Figure 5:
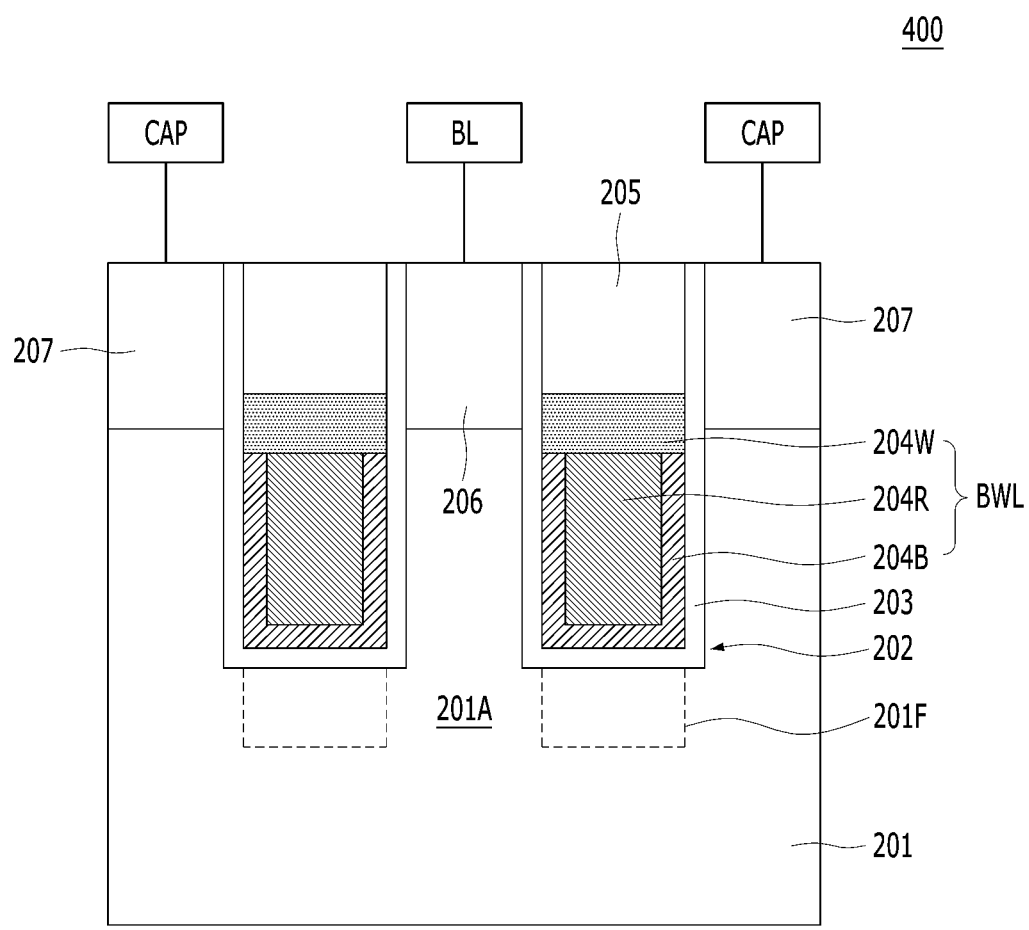

FIG. 5 is a diagram illustrating a semiconductor device according to another embodiment of the present invention. The semiconductor device 400 of FIG. 5 may be similar to the semiconductor devices 200 and 300 of FIGS. 3A and 4. Hereinafter, detailed descriptions of duplicate components may be omitted.

Referring to FIG. 5, the semiconductor device 400 may include a substrate 201 and a buried word line BWL embedded in the substrate 201. A gate insulating layer 203 may be formed on a surface of the trench 202. A buried word line BWL may be formed on the gate insulating layer 203. The buried word line BWL may partially fill the trench 202 on the gate insulating layer 203. A capping layer 205 may be formed on the buried word line BWL to fill the remainder of the trench 202.

The buried word line BWL may include a barrier layer 204B, a low resistivity layer 204R, and a low work function layer 204W. The barrier layer 204B, the low resistivity layer 204R, and the low work function layer 204W may be made of different materials.

The barrier layer 204B may be formed conformally on the gate insulating layer 203. The barrier layer 204B may be void-free. The barrier layer 204B may include a metal-based material including, for example, a metal nitride which may include a dopant. For example, the barrier layer 204B may include titanium nitride containing a dopant such as, for example, silicon. The barrier layer 204B may include silicon-doped titanium nitride, and the silicon-doped titanium nitride may have a silicon concentration of less than 1 at %. The silicon-doped titanium nitride may include silicon at a concentration of less than 1 at % and greater than 0 at %.

The low resistivity layer 204R may include a material having a lower resistivity than that of the barrier layer 204B and the low work function layer 204W. The low resistivity layer 204R may include a metal such as, for example, tungsten.

The low work function layer 204W may include a material having a work function lower than that of the barrier layer 204B and the low resistivity layer 204R. That is, the low work function layer 204W may include a low work function material. The low work function layer 204W may include a low work function metal or an N-type polysilicon.

In this embodiment, the barrier layer 204B may be silicon-doped titanium nitride, the low resistivity layer 204R may be tungsten, and the low work function layer 204W may be an N-type polysilicon. Gate-induced drain leakage (GIDL) may be improved by the low work function of the low work function layer 204W.

The barrier layer 204B may include silicon-doped titanium nitride formed by atomic layer deposition as referenced in FIGS. 1B to 2B. In another embodiment, the barrier layer 204B may include silicon-doped titanium nitride formed by different deposition methods, such as physical vapor deposition (PVD) or chemical vapor deposition (CVD). The low resistivity layer 204R and the low work function layer 204W may be formed by atomic layer deposition (ALD), physical vapor deposition (PVD), or chemical vapor deposition (CVD).

Figure 6:
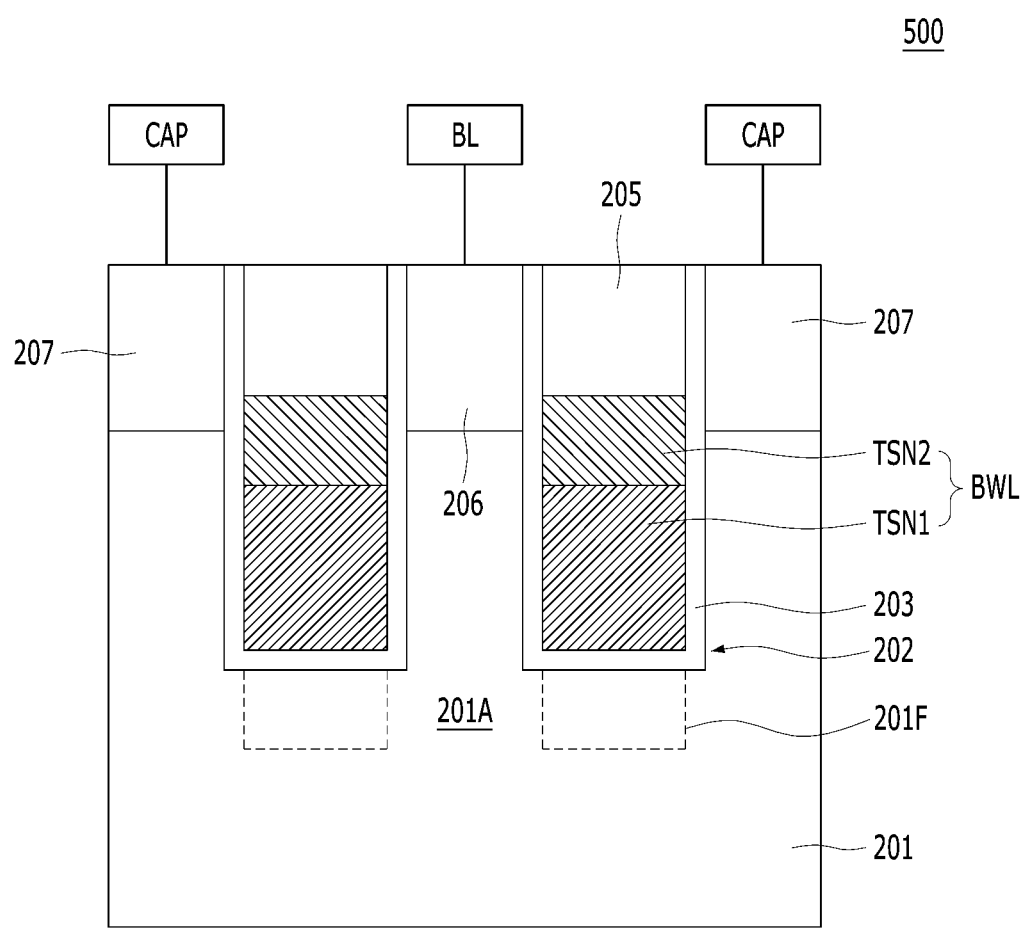

FIG. 6 is a diagram illustrating a semiconductor device according to another embodiment of the present invention. The semiconductor device 500 of FIG. 6 may be similar to the semiconductor device 200 of FIG. 3A. Hereinafter, detailed descriptions of duplicate components may be omitted.

Referring to FIG. 6, the semiconductor device 500 may include a substrate 201 and a buried word line BWL embedded in the substrate 201. A gate insulating layer 203 may be formed on a surface of the trench 202. A buried word line BWL may be formed on the gate insulating layer 203. The buried word line BWL may partially fill the trench 202 on the gate insulating layer 203. A capping layer 205 may be formed on the buried word line BWL to fill the remainder of the trench 202.

The buried word line BWL may include a first silicon-doped metal nitride layer TSN1 and a second silicon-doped metal nitride layer TSN2 formed on the first silicon-doped metal nitride layer TSN1. The first silicon-doped metal nitride layer TSN1 may have a shape filling the bottom of the trench 202. The first silicon-doped metal nitride layer TSN1 and the second silicon-doped metal nitride layer TSN2 may have different silicon concentrations. In another embodiment, the first silicon-doped metal nitride layer TSN1 and the second silicon-doped metal nitride layer TSN2 may have the same silicon concentration.

The first silicon-doped metal nitride layer TSN1 and the second silicon-doped metal nitride layer TSN2 may be void-free. The first silicon-doped metal nitride layer TSN1 and the second silicon-doped metal nitride layer TSN2 according to the embodiment of the present invention may have a silicon concentration of less than 1 at %. The first silicon-doped metal nitride layer TSN1 and the second silicon-doped metal nitride layer TSN2 may include silicon at a concentration of less than 1 at % and greater than 0 at %.

The second silicon-doped metal nitride layer TSN2 may have a lower work function than the first silicon-doped metal nitride layer TSN1.

The first silicon-doped metal nitride layer TSN1 and the second silicon-doped metal nitride layer TSN2 may include silicon-doped titanium nitride formed by atomic layer deposition as referenced in FIGS. 1B to 2B. In another embodiment of the present invention, the first silicon-doped metal nitride layer TSN1 and the second silicon-doped metal nitride layer TSN2 may include silicon-doped titanium nitride deposited by PVD or CVD.

In another embodiment, the buried word line BWL may include a silicon-doped titanium nitride (Si-doped TiN) layer and a titanium silicon nitride (TiSiN) layer on the silicon-doped titanium nitride layer.

The present invention described above is not limited by the above-described embodiments and the accompanying drawings, and it will be apparent to those skilled in the art that various substitutions, modifications, and changes may be made without departing from the spirit and scope of the present invention.

What is claimed is:

1. A semiconductor device, comprising:
    a substrate including a feature;
    a void-free conductive layer disposed inside the feature; and
    a low work function material on the void-free conductive layer,
    wherein the void-free conductive layer includes silicon-doped metal nitride,
    wherein the low work function material includes an N-type impurity-doped polysilicon.

2. The semiconductor device of claim 1, wherein the silicon-doped metal nitride includes silicon-doped titanium nitride.

3. The semiconductor device of claim 1, wherein the silicon-doped metal nitride includes silicon at a concentration of less than 1 at % and greater than 0 at %.

4. The semiconductor device of claim 1, wherein the silicon-doped metal nitride is chlorine-free and crystalline.

5. A semiconductor device, comprising:
    a substrate including a gate trench;
    a gate insulating layer on a surface of the gate trench;
    silicon-doped metal nitride on the gate insulating layer; and
    a low work function material on the silicon-doped metal nitride,
    wherein the silicon-doped metal nitride includes silicon at concentration of less than 1 at %,
    wherein the low work function material includes an N-type impurity-doped polysilicon.

6. The semiconductor device of claim 5, wherein the silicon-doped metal nitride includes silicon-doped titanium nitride.

7. The semiconductor device of claim 5, wherein the low work function material has a lower work function than the silicon-doped metal nitride.

8. The semiconductor device of claim 5, wherein doped metal nitride includes silicon-doped titanium nitride.

9. The semiconductor device of claim 5, further including:
    a low resistivity material on the silicon-doped metal nitride.

10. The semiconductor device of claim 9, wherein the low resistivity material includes tungsten.

11. The semiconductor device of claim 5, wherein the silicon-doped metal nitride is chlorine-free and crystalline.

12. A semiconductor device, comprising:
    a substrate including a first doped region, a second doped region, and a gate trench between the first and second doped regions;
    a gate insulating layer formed on a surface of the gate trench;
    a buried word line disposed inside the gate trench over the gate insulating layer;
    a bit line connected to the first doped region; and
    a capacitor connected to the second doped region,
    wherein the buried word line includes silicon-doped titanium nitride having silicon concentration of less than 1 at %.

13. The semiconductor device of claim 12, wherein the buried word line further includes a low work function material over the silicon-doped titanium nitride.

14. The semiconductor device of claim 13, wherein the low work function material has a lower work function than the silicon-doped titanium nitride.

15. The semiconductor device of claim 13,
    wherein the silicon-doped titanium nitride includes a first silicon-doped titanium nitride,
    wherein the low work function material includes a second silicon-doped titanium nitride, and
    wherein the second silicon-doped titanium nitride has lower work function than the first silicon-doped titanium nitride.

16. The semiconductor device of claim 13, wherein the low work function material includes an N-type impurity-doped polysilicon.

17. The semiconductor device of claim 12, further including:
    a low resistivity material on the silicon-doped titanium nitride; and
    a low work function material on the low resistivity material.

18. The semiconductor device of claim 17, wherein the low resistivity material includes tungsten, and the low work function material includes an N-type impurity-doped polysilicon.

19. The semiconductor device of claim 12, wherein the silicon-doped titanium nitride is chlorine-free and crystalline.

* * * * *